United States Patent
Ueno

(10) Patent No.: US 11,079,458 B2
(45) Date of Patent: Aug. 3, 2021

(54) VOLTAGE SENSOR DIAGNOSIS DEVICE AND VOLTAGE SENSOR DIAGNOSIS METHOD

(71) Applicant: Nissan Motor Co., Ltd., Yokohama (JP)

(72) Inventor: Tomotaka Ueno, Kanagawa (JP)

(73) Assignee: Nissan Motor Co., Ltd., Yokohama (JP)

(*) Notice: Subject to any disclaimer, the term of this patent is extended or adjusted under 35 U.S.C. 154(b) by 111 days.

(21) Appl. No.: 16/623,420

(22) PCT Filed: Jul. 18, 2017

(86) PCT No.: PCT/JP2017/025897
§ 371 (c)(1),
(2) Date: Dec. 17, 2019

(87) PCT Pub. No.: WO2019/016850
PCT Pub. Date: Jan. 24, 2019

(65) Prior Publication Data
US 2020/0124692 A1   Apr. 23, 2020

(51) Int. Cl.
*G01R 35/00*   (2006.01)
*H02P 29/024*   (2016.01)
(Continued)

(52) U.S. Cl.
CPC .......... *G01R 35/00* (2013.01); *G01R 19/165* (2013.01); *G01R 31/34* (2013.01); *H02P 29/0241* (2016.02); *H02P 27/06* (2013.01)

(58) Field of Classification Search
CPC ...... G01R 35/00; G01R 19/165; G01R 31/34; G01R 31/2829; G01R 19/0084; H02P 29/0241; H02P 27/06; H02P 29/024
(Continued)

(56) References Cited

U.S. PATENT DOCUMENTS

2013/0033209 A1    2/2013  Murata et al.
2016/0276990 A1*   9/2016  Aoyama ............... G01D 3/08

FOREIGN PATENT DOCUMENTS

JP     4-191677 A    7/1992
JP     9-218232 A    8/1997
(Continued)

*Primary Examiner* — Farhana A Hoque
(74) *Attorney, Agent, or Firm* — Global IP Counselors, LLP

(57) ABSTRACT

In the voltage sensor diagnostic device, a monitoring device diagnoses a normality/abnormality of a voltage sensor that detects a circuit voltage in a system circuit of a vehicle-mounted motor control system. The monitoring device includes a main multiplier circuit, a subordinate multiplier circuit and an abnormality diagnosis circuit. The main multiplier circuit receives a circuit voltage as an input monitoring voltage and outputs a gain-non-inverted signal as a detected value of the circuit voltage. The subordinate multiplier circuit receives the circuit voltage as the input monitoring voltage and outputs a gain-inverted amplified with respect to the gain-non-inverted output signal from the main multiplier circuit as the detected value. The abnormality diagnosis circuit diagnoses abnormalities in the main multiplier circuit and the subordinate multiplier circuit, which are voltage sensors, based on the gain-non-inverted output signal from the main multiplier circuit and the gain-inverted output signal from the subordinate multiplier circuit.

6 Claims, 10 Drawing Sheets

(51) Int. Cl.
*G01R 19/165* (2006.01)
*G01R 31/34* (2020.01)
*H02P 27/06* (2006.01)

(58) Field of Classification Search
USPC .............................................. 324/140 R, 142
See application file for complete search history.

(56) References Cited

FOREIGN PATENT DOCUMENTS

| | | |
|---|---|---|
| JP | 2009-145139 A | 7/2009 |
| JP | 2010-139244 A | 6/2010 |
| JP | 2013-34319 A | 2/2013 |
| JP | 2016-171542 A | 9/2016 |
| JP | 2017-83360 A | 5/2017 |

* cited by examiner

VOLTAGE SENSOR DIAGNOSIS DEVICE AND VOLTAGE SENSOR DIAGNOSIS METHOD

CROSS-REFERENCE TO RELATED APPLICATIONS

This application is a U.S. national stage application of International Application No. PCT/JP2017/025897, filed on Jul. 18, 2017.

BACKGROUND

Technical Field

The present disclosure relates to a voltage sensor diagnostic device and a voltage sensor diagnostic method for diagnosing a normality/abnormality of a voltage sensor that detects circuit voltage in a system circuit of an electrical equipment system.

Background Information

The following method is known from the prior art as a sensor abnormality detection method. Detected values Ca, Cb of two current sensors that detect motor drive current are sampled and a counter value CNT of an abnormality counter 14 is incremented when the difference ΔC between these current sensor detected values Ca, Cb exceeds a threshold Cth. On the other hand, if the difference ΔC is less than or equal to the threshold Cth, it is determined whether the sampling timing of the detected values Ca, Cb is in the vicinity of a zero-crossing of the motor drive current, the counter value CNT of the abnormality counter 14 is maintained if the timing is in the vicinity of the zero-crossing, and the counter value CNT of the abnormality counter 14 is reset if the timing is not in the vicinity of the zero-crossing. When the counter value CNT of the abnormality counter 14 reaches a prescribed reference value, it is determined that one of the two current sensors is in an abnormal state, and a relay drive signal RS is output (for example, refer to Japanese Laid-Open Patent Application No. 2010-139244).

SUMMARY

However, in the conventional device, there is the problem that if an abnormality occurs in which the detected values Ca, Cb vary in the same direction, a current sensor abnormality cannot be detected even if the difference ΔC between the detected value Ca and the detected value Cb, which are the same value, is calculated.

In view of the problem described above, an object of the present disclosure is to provide a voltage sensor diagnostic device and a voltage sensor diagnostic method that detect abnormalities in which the detected voltage values of a circuit voltage vary in the same direction.

In order to achieve the object described above, the present disclosure comprises a monitoring device for diagnosing a normality/abnormality of a voltage sensor that detects circuit voltage in a system circuit of an electrical equipment system. In this voltage sensor diagnostic device, the monitoring device includes a main multiplier circuit, a subordinate multiplier circuit, and an abnormality diagnosis circuit. The main multiplier circuit receives, as input, a circuit voltage as a monitoring voltage and outputs a gain-non-inverted signal as a detection value of the circuit voltage. The subordinate multiplier circuit receives, as input, the circuit voltage as the monitoring voltage and outputs a signal that is gain-inverted with respect to the output signal from the main multiplier circuit as the detection value of the circuit voltage. The abnormality diagnosis circuit diagnoses abnormalities of the main multiplier circuit and the subordinate multiplier circuit, which are the voltage sensors, based on the gain-non-inverted output signal from the main multiplier circuit and the gain-inverted output signal from the subordinate multiplier circuit.

As described above, by means of the above-described configuration in which the difference between the two output signals from the main multiplier circuit and the subordinate multiplier circuit, which are voltage sensors, is increased when the detected voltage values of the circuit voltage vary in the same direction, it is possible to detect abnormalities in which the detected voltage values of the circuit voltage vary in the same direction.

DETAILED DESCRIPTION OF THE EMBODIMENTS

Figure 1:
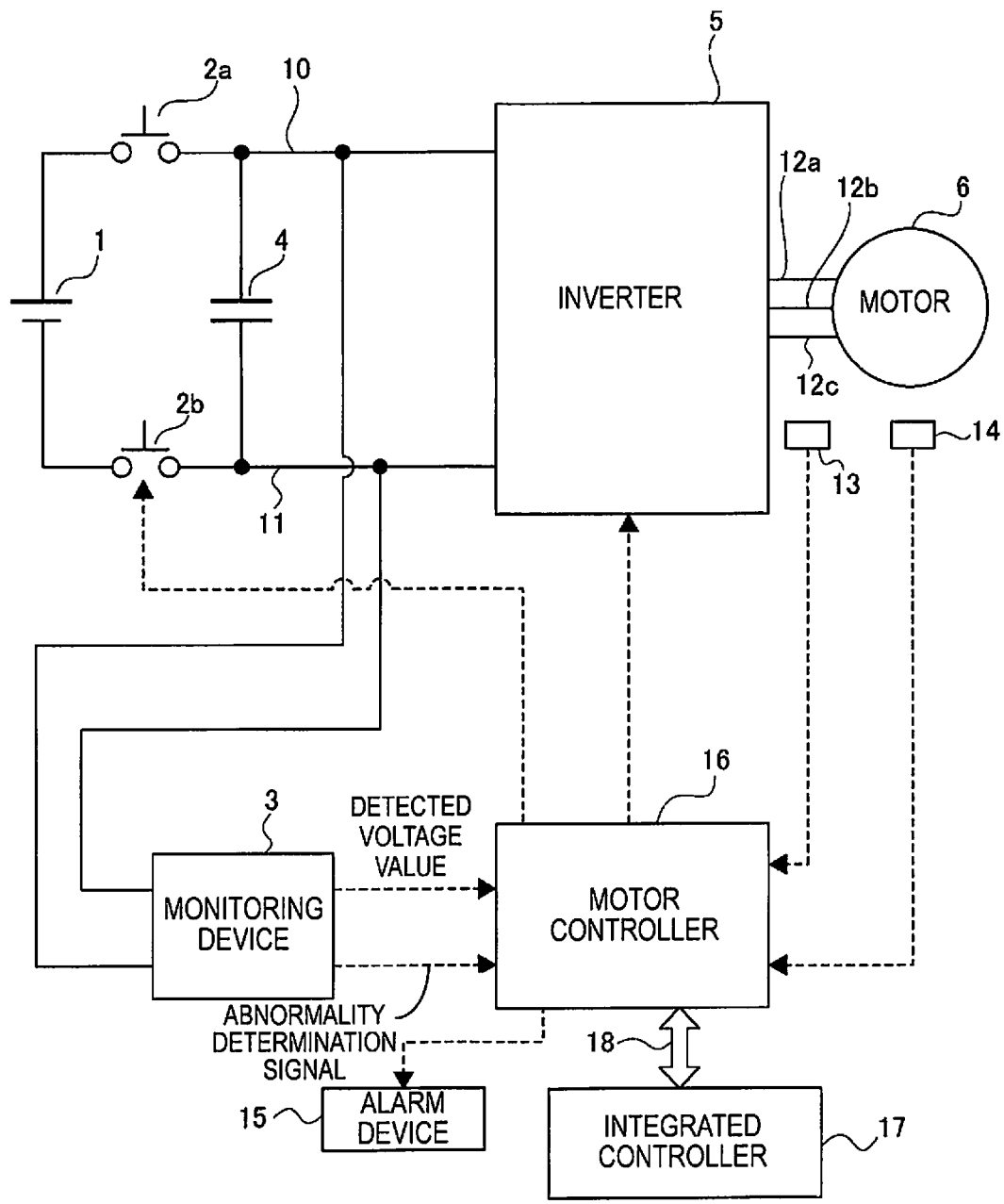
FIG. 1 is an overall system diagram illustrating a vehicle-mounted motor control system (one example of an electrical equipment system) to which a voltage sensor diagnostic device and a voltage sensor diagnostic method are applied according to a first embodiment.

Preferred embodiments for realizing a voltage sensor diagnostic device and a voltage sensor diagnostic method according to the present disclosure will be described below with reference to Embodiments 1 to 4 illustrated in the drawings.

First Embodiment

The configuration is described first. The voltage sensor diagnostic device and the voltage sensor diagnostic method according to first to fourth embodiments are applied to a vehicle-mounted motor control system (one example of an electrical equipment system) for controlling a motor/generator mounted on a drive source of an electrically driven vehicle, such as an electric vehicle or a hybrid vehicle. The "overall system configuration" and the "detailed configuration of the monitoring device" will be described separately below regarding the configuration of the first embodiment.

Overall System Configuration

FIG. 1 illustrates a vehicle-mounted motor control system to which the voltage sensor diagnostic device and the voltage sensor diagnostic method are applied according to the first embodiment. The overall system configuration will be described below based on FIG. 1.

As shown in FIG. 1, a system circuit of the vehicle-mounted motor control system comprises a battery 1, relays 2a, 2b, a smoothing capacitor 4, an inverter 5, and a motor 6.

The battery 1 is installed in a vehicle as a motor power supply that drives the motor 6. For example, a large-capacity lithium-ion battery referred to as a high-power battery, etc., is used as the battery 1.

The relays 2a, 2b are respectively provided on two connection lines 10, 11 that connect the battery 1 and the inverter 5, and are switches that switch between energization connection/energization interruption with the motor 6. The relays 2a, 2b are controlled to be opened and closed by a motor controller 16.

The smoothing capacitor 4 is connected across the two connection lines 10, 11, which connect the battery 1 and the inverter 5, in parallel with the battery 1, and smooths the voltage fluctuations to a low value.

The inverter 5 bidirectionally converts DC voltage on the battery 1 side to three-phase AC voltage on the motor 6 side. In the case of an electrically driven vehicle, when the motor is driven by means of motor powering, the DC voltage input by means of battery discharge is converted into three-phase alternating current, which is output to the motor 6. On the other hand, during motor power generation by means of motor regeneration, three-phase AC voltage from the motor 6 is converted into DC voltage, which charges the battery 1.

The motor 6 is a three-phase synchronous motor in which a permanent magnet is embedded in the motor rotor, in which the inverter 5 and the stator windings of the motor are connected via the U-phase line 12a, a V-phase line 12b, and a W-phase line 12c. The motor and the inverter are not limited to the motor 6 and the inverter 5 described above, and the motor can be a DC motor, a six-phase induction motor, etc.

As shown in FIG. 1, the motor control system of the vehicle-mounted motor control system comprises a monitoring device 3, a current sensor 13, a resolver 14, an alarm device 15, the motor controller 16, and an integrated controller 17.

The input voltage from the two connection lines 10, 11 are input as monitoring voltage to the monitoring device 3, which diagnoses a normality/abnormality of the voltage sensor (main multiplier circuit 7, subordinate multiplier circuit 8) which detects circuit DC voltage that flows in the system circuit of the vehicle-mounted motor control system based on the input monitoring voltage. When the voltage sensor is diagnosed as abnormal in the monitoring device 3, an abnormality determination signal from the monitoring device 3 is output to the motor controller 16. The monitoring interval of the monitoring voltage by the monitoring device 3 is, for example, between a minimum monitoring voltage Vmin (about 60 V) to a maximum monitoring voltage Vmax (about 600 V).

Here, the main multiplier circuit 7 and the subordinate multiplier circuit 8 each converts a high voltage (monitoring voltage) applied between the connection lines 10, 11 into a detected voltage value in a voltage range (0 to 5 volt range) that can be recognized by an abnormality diagnosis circuit 9. That is, the main multiplier circuit 7 and the subordinate multiplier circuit 8 function as "DC voltage sensors" that convert the circuit voltage (DC voltage across the two ends of the smoothing capacitor 4 and the input DC voltage to the inverter 6) into a detected voltage value and detects the detected voltage value. Then, the main multiplier circuit 7 and the subordinate multiplier circuit 8 are configured as a redundant circuit provided in parallel with each other.

The motor controller 16 receives a target motor torque command input value from the integrated controller 17 via a CAN communication line 18 during motor torque control, and a target motor rotation speed command input value during motor rotational speed control. Then, a control command value with which the target motor torque and the target motor rotation speed can be obtained is calculated, and the control command value is output to the inverter 5.

The detected voltage value from the monitoring device 3, detected current value from the current sensor 13, detected motor rotational position value from the resolver 14, and the like, are input to the motor controller 16 as required control information, when motor torque control and motor rotational speed control are executed. When the detected voltage value from the monitoring device 3 is an analog value, an A-D conversion is carried out by an input unit of the motor controller 16 to carry out motor control.

In addition, when the abnormality determination signal from the monitoring device 3 is input to the motor controller 16, the latter outputs an alarm command to the alarm device 15 to notify the driver that there is an abnormality in the circuit DC voltage flowing in the system circuit. The alarm device 15 can be an alarm display that notifies the driver only visually, or can be used in combination with an alarm buzzer that audibly notifies the driver.

Detailed Configuration of Monitoring Device

Figure 2:
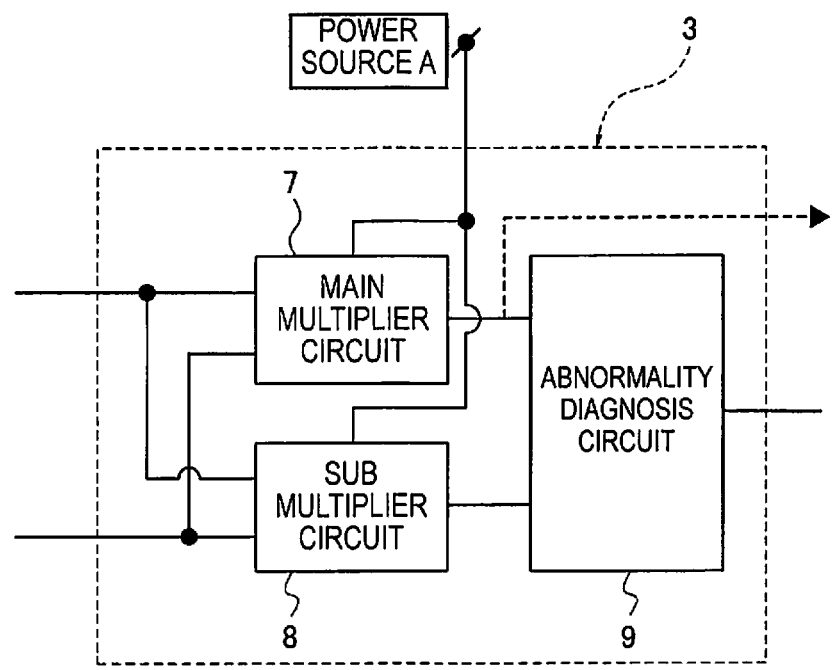
FIG. 2 is a circuit block diagram illustrating a monitoring device according to the first embodiment.

FIG. 2 illustrates the monitoring device 3 according to the first embodiment. The internal configuration of the monitoring device 3 will be described below with reference to FIG. 2.

As shown in FIG. 2, the monitoring device 3 is provided with the main multiplier circuit 7, the subordinate multiplier circuit 8, and the abnormality diagnosis circuit 9.

The main multiplier circuit 7 receives the circuit voltage of the two connection lines 10, 11 as input monitoring voltage and outputs to the abnormality diagnosis circuit 9 a main multiplier circuit output (gain-non-inverted output signal) which is not gain-inverted as the detected value of the circuit voltage. Then, the main multiplier circuit output is output to the motor controller 16 as the detected voltage value (broken line in FIG. 2).

The subordinate multiplier circuit 8 receives the circuit voltage of the two connection lines 10, 11 as input monitoring voltage and outputs a subordinate multiplier circuit output (gain-inverted output signal) which is gain-inverted with respect to the main multiplier circuit output from the main multiplier circuit 7 as the detected value of the circuit voltage. As shown in FIG. 2, a power source A that supplies power to both circuits 7, 8 is connected to the main multiplier circuit 7 and the subordinate multiplier circuit 8.

The abnormality diagnosis circuit 9 is constituted by a microcomputer and diagnoses abnormalities of the main multiplier circuit 7 and the subordinate multiplier circuit 8, which are DC voltage sensors, based on the main multiplier circuit output (gain-non-inverted output signal) from the main multiplier circuit 7 and the subordinate multiplier circuit output (gain-inverted output signal) from the subordinate multiplier circuit 8. Here, when the outputs from the main multiplier circuit 7 and the subordinate multiplier circuit 8 are analog values, A-D conversion is carried out by the input unit of the abnormality diagnosis circuit 9 to execute the abnormality diagnosis.

The detailed configuration of each circuit will be described below with regard to the main multiplier circuit configuration, the subordinate multiplier circuit configuration, and the abnormality diagnosis circuit configuration.

Main Multiplier Circuit Configuration

Figure 3:
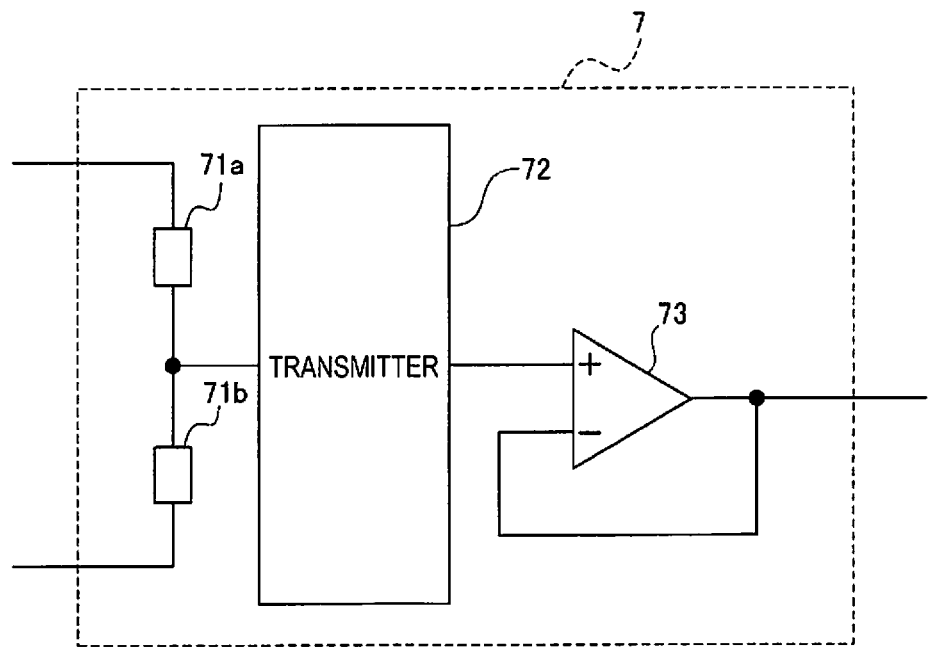
FIG. 3 is a circuit block diagram illustrating a configuration example of a main multiplier circuit in the monitoring device according to the first embodiment.
Figure 5:
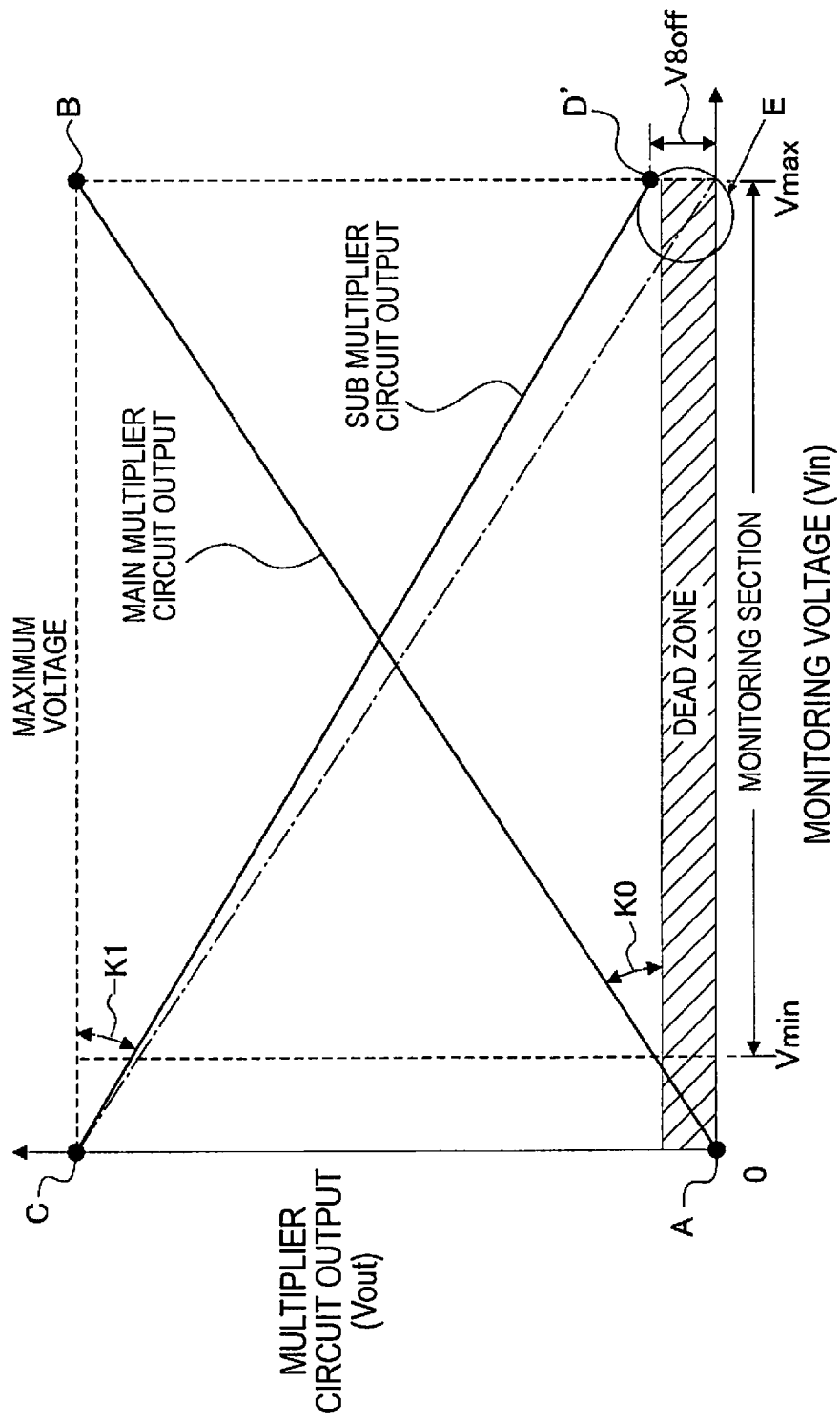
FIG. 5 is a multiplier circuit output characteristic diagram illustrating a main multiplier circuit output characteristic and a subordinate multiplier circuit output characteristic in the monitoring device according to the first embodiment.

FIG. 3 illustrates a configuration example of the main multiplier circuit 7 in the monitoring device 3 according to the first embodiment. FIG. 5 illustrates the output characteristics of the main multiplier circuit. The detailed configuration of the main multiplier circuit 7 will be described below, with reference to FIGS. 3 and 5.

As shown in FIG. 3, the main multiplier circuit 7 includes a gain-adjustment resistor 71a, a gain-adjustment resistor 71b, a transmitter 72, and an operational amplifier 73. The operational amplifier 73 has a circuit configuration using bipolar transistors.

In the main multiplier circuit 7, the monitoring voltage voltage-divided by the gain-adjustment resistor 71a and the gain-adjustment resistor 71b is input to the operational amplifier 73 via the transmitter 72 across an insulator and is set as the main multiplier circuit output (gain-non-inverted output signal) by the operational amplifier 73. The transmitter 72 can output an analog signal input as an analog signal. The transmitter 72 can also output an analog signal input as a digital signal. In this case, the operational amplifier 73 is not necessary. In addition, gain-adjustment can be carried out by a general multiplier circuit that uses the operational amplifier 73 and a resistor.

The main multiplier circuit 7 sets the output characteristic of the main multiplier circuit to a characteristic having a reference gain K0 (gain: slope of the multiplier circuit output characteristic) where the main multiplier circuit output [Vout] passes through zero voltage and the maximum voltage, as shown in FIG. 5. That is, the output characteristic of the main multiplier circuit has a positively sloped linear characteristic that connects a zero voltage point A (intersection of 0 V main multiplier circuit output and 0V monitoring voltage) and a maximum voltage point B (for example, intersection of main multiplier circuit output of 5 V and monitoring voltage of 600 V).

Here, since the output characteristic of the main multiplier circuit can be derived from an input/output relation characteristic in which the monitoring voltage [Vin] is the horizontal axis and the main multiplier circuit output [Vout] is the vertical axis, the output can be expressed by the following equation $$Vout=\{R71b/(R71a+R71b)\}\cdot Vin$$

As is clear from this equation, the reference gain K0 is $$K0=R71b/(R71a+R71b)$$

and the adjustment of the reference gain K0 is carried out by setting the resistance R71a of the gain-adjustment resistor 71a and the resistance R71b of the gain-adjustment resistor 71b.

Subordinate Multiplier Circuit Configuration

Figure 4:
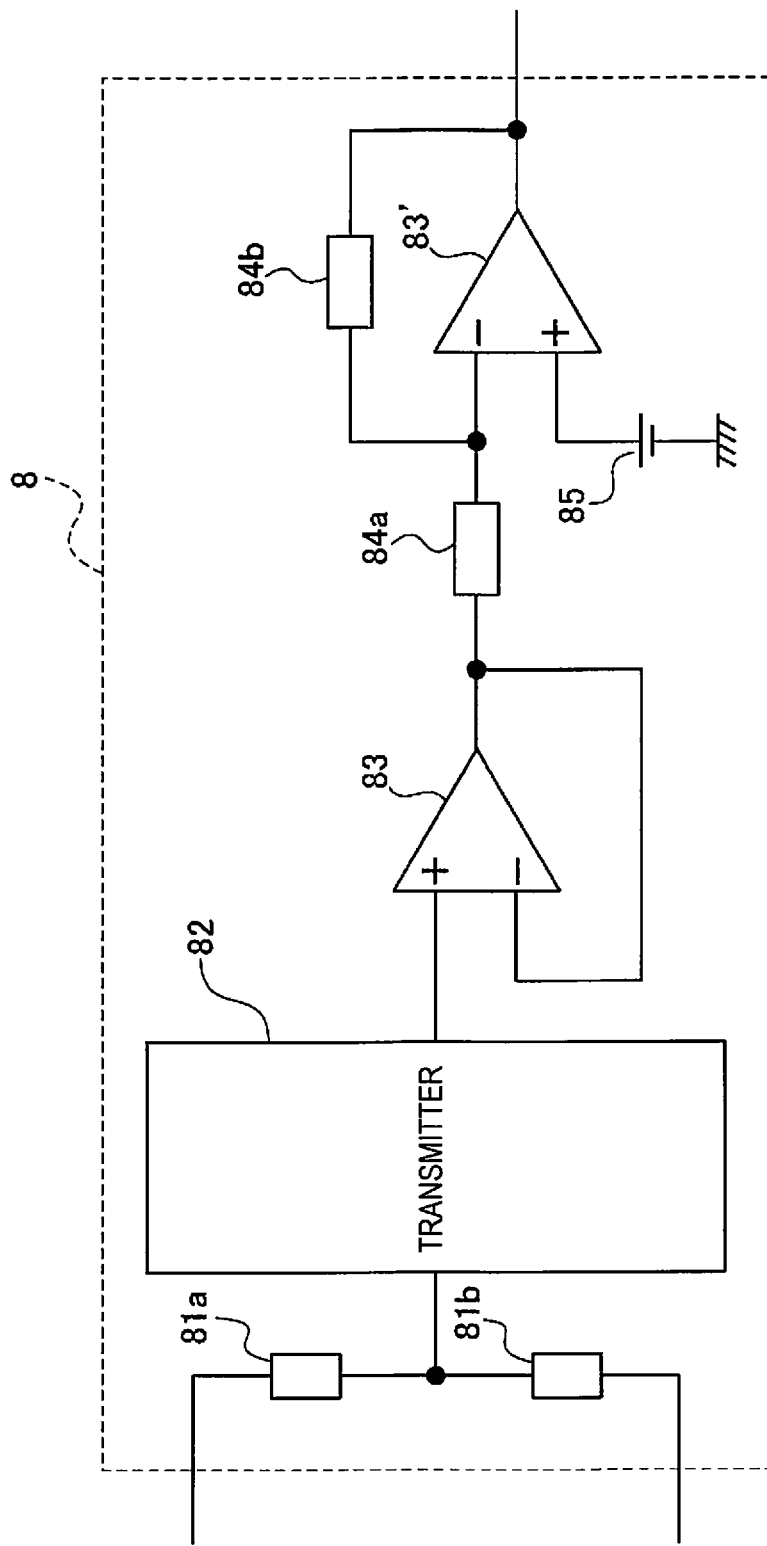
FIG. 4 is a circuit block diagram illustrating a configuration example of a subordinate multiplier circuit in the monitoring device according to the first embodiment.

FIG. 4 illustrates a configuration example of the subordinate multiplier circuit 8 in the monitoring device 3 according to the first embodiment, and FIG. 5 illustrates the output characteristic of the subordinate multiplier circuit. The detailed configuration of the subordinate multiplier circuit 8 will be described below with reference to FIGS. 4 and 5.

As shown in FIG. 4, the subordinate multiplier circuit 8 includes a gain-adjustment resistor 81a, a gain-adjustment resistor 81b, a transmitter 82, an operational amplifier 83, a gain-adjustment resistor 84a, a gain-adjustment resistor 84b, an operational amplifier 83', and a reference power source 85. The operational amplifiers 83, 83' have a circuit configuration using bipolar transistors.

In other words, the subordinate multiplier circuit 8 is obtained by adding a gain-inverting circuit composed of the operational amplifier 83', the gain-adjustment resistors 84a, 84b, and the reference power source 85 to the configuration of the main multiplier circuit 7. As with the transmitter 72, the transmitter 82 can output an analog signal from an analog signal input. The transmitter can also output an analog signal form a digital signal input.

By setting the absolute value of the gain |−K1| to be smaller than the reference gain K0, the subordinate multiplier circuit 8 sets the output characteristic of the subordinate multiplier circuit to a characteristic in which an offset V8off is added to a dead zone region in which the subordinate multiplier circuit output [Vout] is small, as shown in FIG. 5. The output characteristic of the subordinate multiplier circuit is a negatively sloped linear characteristic that connects a maximum voltage point C (intersection of subordinate multiplier circuit output of 5 V and monitoring voltage of 0 V) and a minimum voltage point D' (for example, intersection of subordinate multiplier circuit output of 0.5 V and monitoring voltage of 600 V). The offset V8off is set so as to avoid the dead zone region of the subordinate multiplier circuit output [Vout].

Here, since the output characteristic of the subordinate multiplier circuit can be derived from an input/output relation characteristic in which the monitoring voltage [Vin] is the horizontal axis and the subordinate multiplier circuit output [Vout] is the vertical axis, the output can be expressed by the following equation $$Vout=-\{R81b/(R81a+R81b)\}\cdot(R84b/R84a)\cdot Vin+\{(R84a+R84b)/R84a\}\cdot V85.$$

As is clear from this equation, the gain −K1 (|−K1|<K0) is $$-K1=-\{R81b/(R81a+R81b)\}\cdot(R84b/R84a)$$

and the adjustment of the gain −K1 is carried out by setting respective resistances R81a, R81b, R84a, R84b of the gain-adjustment resistors 81a, 81b, 84a, 84b.

In addition, the offset V8off is $$V8off=-\{R81b/(R81a+R81b)\}\cdot(R84b/R84a)\cdot Vmax+\{(R84a+R84b)/R84a\}\cdot V85$$

and the adjustment of the offset V8off is carried out by setting the respective resistances R84a, R84b of the gain-adjustment resistors 84a, 84b, and a reference power source voltage V85 of the reference power source 85.

Abnormality Diagnosis Circuit Configuration

Figure 6:
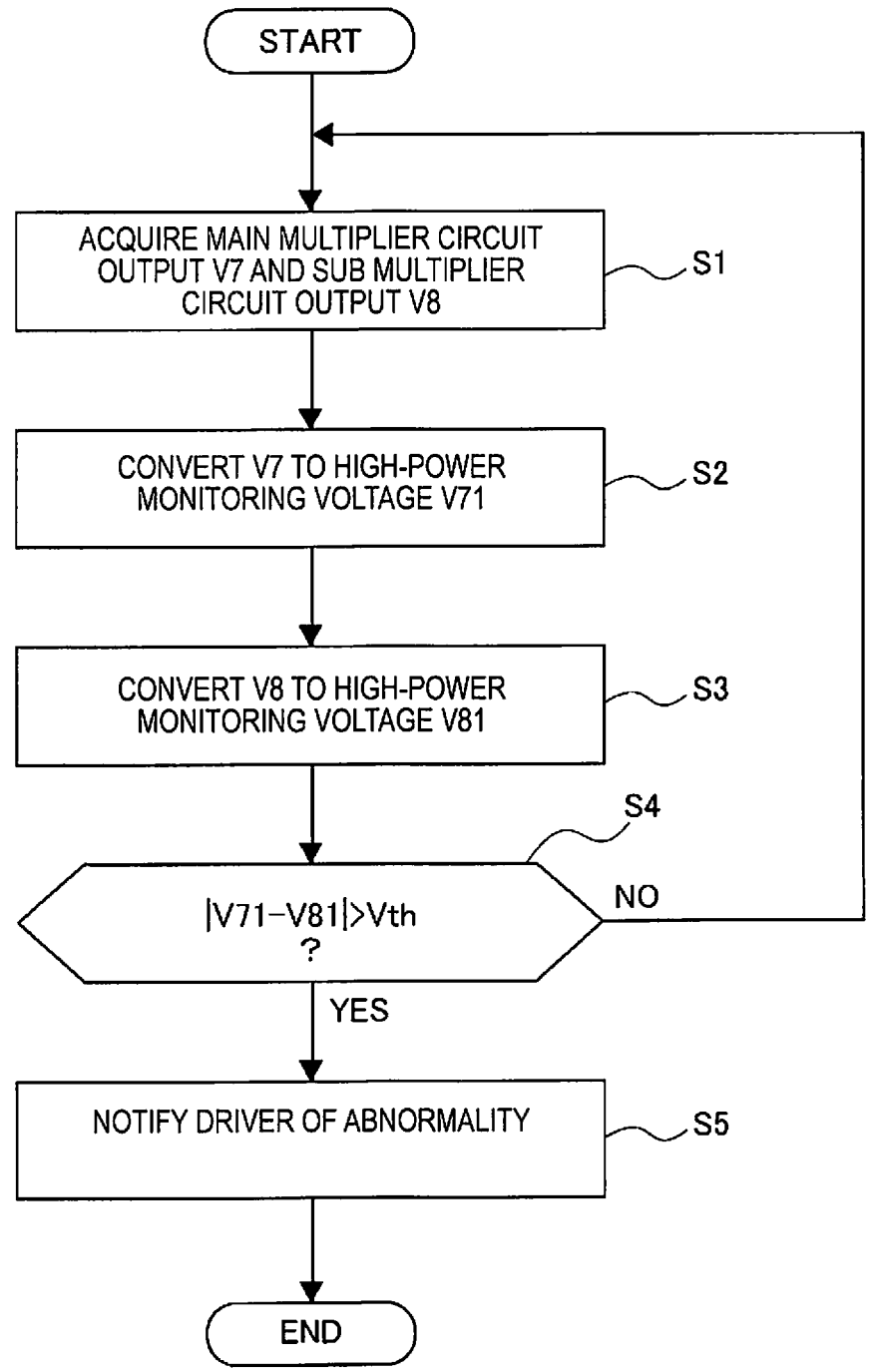
FIG. 6 is a flow chart illustrating the flow of a detected voltage value abnormality diagnosis process executed in an abnormality diagnosis circuit in the monitoring device according to the first embodiment.

FIG. 6 illustrates the flow of a detected voltage value abnormality diagnosis process executed in the abnormality diagnosis circuit 9 in the monitoring device 3 according to the first embodiment. Each of the steps in FIG. 6, which represents the configuration of the abnormality diagnosis circuit, will be described below.

In Step S1, when the abnormality diagnosis process is started, or it is determined that |V71−V81|≤Vth in Step S4, a main multiplier circuit output V7 (=Vout) and a subordinate multiplier circuit output V8 (=Vout) are acquired, and the process proceeds to Step S2.

In Step S2, following the acquisition of the multiplier circuit outputs V7, V8 in Step S1, the main multiplier circuit output V7 is converted into a high-power monitoring voltage V71, and the process proceeds to Step S3.

Here, when converting the main multiplier circuit output V7 to the high-power monitoring voltage V71, a high-power monitoring voltage conversion formula having the same characteristics as the output characteristic of the main multiplier circuit shown in FIG. 5 is set in advance, and the main multiplier circuit output V7 is converted into the high-power monitoring voltage V71 using the high-power monitoring voltage conversion formula.

In Step S3, following the conversion to the high-power monitoring voltage V71 in Step S2, the subordinate multiplier circuit output V8 is converted into a high-power monitoring voltage V81, and the process proceeds to Step S4. Here, when converting the subordinate multiplier circuit output V8 to the high-power monitoring voltage V31, a high-power monitoring voltage conversion formula having the same characteristics as the output characteristic of the subordinate multiplier circuit shown in FIG. 5 is set in advance, and the subordinate multiplier circuit output V8 is converted into the high-power monitoring voltage V81 using the high-power monitoring voltage conversion formula.

In Step S4, following the conversion to the high-power monitoring voltage V81 in Step S3, it is determined whether the absolute value of the difference |V71−V81| between the high-power monitoring voltage V71 and the high-power monitoring voltage V81 exceeds a difference diagnosis threshold Vth. If YES (|V71−V81|>Vth), the process proceeds to Step S5, and if NO (|V71−V81|≤Vth), the process returns to Step S1. Here, the "difference diagnosis threshold Vth" is preferably set to a value that does not cause an erroneous diagnosis when there is no abnormality, in consideration of monitoring variability. That is, the difference diagnosis threshold Vth is set to a value obtained by adding an erroneous diagnosis prevention margin (+a) to a maximum difference voltage value that is assumed to be the amount of the monitoring voltage variability.

In Step S5, following the determination that |V71−V81|>Vth in Step S4, the driver is notified of the abnormality and the process proceeds to END.

Here, the abnormality notification to the driver is carried out by an operation command output to the alarm device 15.

Next, the operations will be described. "Operation of voltage sensor abnormality diagnosis by means of gain inversion," "operation of voltage sensor abnormality diagnosis by means of voltage difference absolute value," and "operation of voltage sensor abnormality diagnosis by means of offset addition" will be described separately regarding the operations of the first embodiment.

Operation of Voltage Sensor Abnormality Diagnosis Using Gain Inversion

For example, the detected values of two voltage sensors are sampled, and a counter value of an abnormality counter is incremented if the difference between these detected values of the voltage sensors exceeds a threshold value. On the other hand, when the difference is less than or equal to a threshold value, the counter value of the abnormality counter is maintained if the sampling timing of the detected values is in the vicinity of the zero-crossing, and the counter value of the abnormality counter is reset if the timing is not in the vicinity of the zero-crossing. Then, when the counter value of the abnormality counter reaches a prescribed reference value, it is determined that one of the two voltage sensors is in an abnormal state; this process shall serve as a comparative example.

In the case of this comparative example, if an abnormality such as a disconnection or a short circuit occurs in which the detected values vary in the same direction, even if the difference between the two detected voltage values, which are the same value, is calculated, the difference would be less than or equal to the threshold value, so that the abnormality of the voltage sensors cannot be detected.

In contrast, in the first embodiment, the monitoring device 3 includes the main multiplier circuit 7, the subordinate multiplier circuit 8, and the abnormality diagnosis circuit 9. The abnormality diagnosis circuit 9 diagnoses abnormalities of the main multiplier circuit 7 and the subordinate multiplier circuit 8, which are the voltage sensors, based on the main multiplier circuit output by means of a gain-non-inverted output signal from the main multiplier circuit 7, and the subordinate multiplier circuit output by means of a gain-inverted output signal from the subordinate multiplier circuit 8.

That is, the main multiplier circuit output [Vout] is output from the main multiplier circuit 7 to which the monitoring voltage [Vin] is input without gain-inversion. On the other hand, the subordinate multiplier circuit output [Vout] is output from the subordinate multiplier circuit 8 to which the monitoring voltage [Vin] is input with gain-inversion with respect to the main multiplier circuit output. Therefore, under normal circumstances, the main multiplier circuit output [Vout] and the subordinate multiplier circuit output [Vout], which are output signals of the main multiplier circuit 7 and the subordinate multiplier circuit 8, change in different direction with respect to the variation of the monitoring voltage [Vin].

In contrast, when an abnormality occurs in the power source A, which supplies electric power to the main multiplier circuit 7 and the subordinate multiplier circuit 8, and an abnormality occurs in which the main multiplier circuit output [Vout] and the subordinate multiplier circuit output [Vout], which are the output signals of the main multiplier circuit 7 and the subordinate multiplier circuit 8, change in the same direction, the abnormality diagnosis circuit 9 can determine that the relationship between the main multiplier circuit output [Vout] and the subordinate multiplier circuit output [Vout] is different from the normal state.

Accordingly, it is possible to detect abnormalities in which the detected voltage values of the circuit voltage in the system circuit of the vehicle-mounted motor control system vary in the same direction.

Operation of Voltage Sensor Abnormality Diagnosis Using Voltage Difference Absolute Value In the case of the comparative example described above, at the time of the circuit voltage abnormality diagnosis, a determination regarding whether the difference between the detected values of the voltage sensor exceeds the threshold value, a determination of the sampling timing of the detected values, and a determination that the counter value of the abnormality counter has reached the prescribed reference value are carried out. Thus, as a result of requiring many determinations at the time of the circuit voltage abnormality diagnosis, the abnormality determination process becomes complex, in addition to which a response delay occurs from the timing at which the voltage sensor abnormality occurs until the abnormality is diagnosed.

In contrast, in the first embodiment, the abnormality diagnosis circuit 9 converts the main multiplier circuit output V7 from the main multiplier circuit 7 into the high-power monitoring voltage V71, and converts the subordinate multiplier circuit output V8 from the subordinate multiplier circuit 8 into the high-power monitoring voltage V81. Then, when the absolute value of the difference |V71−V81| between the high-power monitoring voltage V71 and the high-power monitoring voltage V81 exceeds the difference diagnosis threshold Vth, the main multiplier circuit 7 and the subordinate multiplier circuit 8, which are the voltage sensors, are diagnosed as abnormal.

That is, while |V71−V81|≤Vth is satisfied, the process that proceeds from Step S1→Step S2→Step S3→Step S4 is repeated in the flow chart of FIG. 6, and the monitoring device 3 diagnoses the main multiplier circuit 7 and the subordinate multiplier circuit 8, which are the voltage sensors, as normal. On the other hand, when |V71−V81|>Vth, the process proceeds from Step S4 to Step S5→END in the flow chart of FIG. 6, and the monitoring device 3 diagnoses the main multiplier circuit 7 and the subordinate multiplier circuit 8, which are the voltage sensors, as abnormal.

Accordingly, by being able to carry out the voltage sensor abnormality diagnosis with only one determination, the abnormality diagnosis process is simplified, in addition to which, when an abnormality occurs in the main multiplier circuit 7 and the subordinate multiplier circuit 8, which are the voltage sensors, it is possible to diagnose the voltage sensor abnormality with good responsiveness.

Operation of Voltage Sensor Abnormality Diagnosis Using Offset Addition

When the main multiplier circuit 7 and the subordinate multiplier circuit 8 are configured using low-cost but reliable elements, there are cases in which there is a dead zone in the main multiplier circuit output [Vout] and the subordinate multiplier circuit output [Vout]. For example, in the case of a circuit configuration using bipolar elements, it is not possible to output a complete low level or a complete high level due to the saturation characteristics of bipolar transistors. Accordingly, for example, in the case of a system in which it is sufficient to monitor voltages that are higher than 60 V, the system is designed such that a monitoring result of 60 V or lower corresponds to a saturation region.

However, when it is attempted to diagnose an abnormality in the circuit voltage by means of simple gain inversion, the output characteristic of the subordinate multiplier circuit is such that the monitoring result of the monitoring voltage [Vin] in the vicinity of the maximum monitoring voltage Vmax corresponds to the saturation region (dead zone), as indicated by the dashed-dotted line characteristic of FIG. 5 (region surrounded by arrow E in FIG. 5). As a result, when the monitoring voltage [Vin] is in the vicinity of the maximum monitoring voltage Vmax, a high-precision subordinate multiplier circuit output [Vout] cannot be output.

In contrast, in the first embodiment, the main multiplier circuit 7 sets the output characteristic of the main multiplier circuit to a characteristic having the reference gain K0 with which the main multiplier circuit output [Vout] passes zero voltage and the maximum voltage. On the other hand, the absolute value of the gain |−K1| is set to be smaller than the reference gain K0, and the output characteristic of the subordinate multiplier circuit 8 is set to a characteristic in which the offset V8off is added to the dead zone region in which the subordinate multiplier circuit output [Vout] is small.

That is, by setting the absolute value of the gain |−K1| of the output characteristic of the subordinate multiplier circuit smaller than the reference gain K0, the offset V8off is added to the dead zone region in which the subordinate multiplier circuit output [Vout] is small. As a result, as shown in the output characteristic of the subordinate multiplier circuit (solid line characteristic) in FIG. 5, it is possible to prevent the subordinate multiplier circuit output [Vout] in the vicinity of the maximum monitoring voltage Vmax of the monitoring voltage [Vin] from entering the saturation region (dead zone).

Then, in the case of the first embodiment, the system at most needs to monitor the minimum monitoring voltage Vmin (for example, about 60 V. As a result, regarding the output characteristic of the main multiplier circuit, the main multiplier circuit output [Vout] in the vicinity of the minimum monitoring voltage Vmin of the monitoring voltage [Vin] is prevented from entering the saturation region (dead zone), even if a characteristic to which an offset has been added were not used, as shown in FIG. 5.

Accordingly, even if the main multiplier circuit 7 and the subordinate multiplier circuit 8 are configured from low-cost but reliable bipolar elements, the influence of the dead zone would be eliminated. It is thereby possible to accurately diagnose voltage sensor abnormalities in all the monitoring sections (minimum monitoring voltage Vmin to maximum monitoring voltage Vmax).

Since the output of the subordinate multiplier circuit 8 has a smaller gain relative to the output of the main multiplier circuit 7, the accuracy of the voltage sensor will be poor, but since the primary voltage sensor function is assumed by the main multiplier circuit 7, as shown in FIG. 2, this problem is overcome. In addition, the abnormality diagnosis circuit 9 would not make an erroneous diagnosis if set to the difference diagnosis threshold Vth that takes into consideration the deterioration of the accuracy of the subordinate multiplier circuit 8.

Next, the effects are described. The effects listed below can be realized by means of the voltage sensor diagnostic device and the voltage sensor diagnostic method of the first embodiment.

(1) The monitoring device 3 for diagnosing a normality/abnormality of the voltage sensor that detects the circuit voltage in a system circuit of an electrical equipment system (vehicle-mounted motor control system) is provided. In the voltage sensor diagnostic device, the monitoring device 3 includes the main multiplier circuit 7, the subordinate multiplier circuit 8, and the abnormality diagnosis circuit 9. The main multiplier circuit 7 receives the circuit voltage as the input monitoring voltage [Vin] and outputs a signal (main multiplier circuit output [Vout]) that is not gain non-inverted as the detected value of the circuit voltage. The subordinate multiplier circuit 8 receives the circuit voltage as the input monitoring voltage [Vin] and outputs a signal (subordinate multiplier circuit output [Vout]) which is gain-inverted with respect to the output signal from the main multiplier circuit 7 as the detected value of the circuit voltage. The abnormality diagnosis circuit 9 diagnoses abnormalities of the main multiplier circuit 7 and the subordinate multiplier circuit 8, which are the voltage sensors, based on the gain-non-inverted output signal (main multiplier circuit output [Vout]) from the main multiplier circuit 7, and the gain-inverted output signal (subordinate multiplier circuit output [Vout]) from the subordinate multiplier circuit 8 (FIG. 2). As a result, it is possible to provide a voltage sensor diagnostic device that detects abnormalities in which the detected voltage values of the circuit voltage vary in the same direction.

(2) The abnormality diagnosis circuit 9 converts the gain-non-inverted output signal (main multiplier circuit output V7) from the main multiplier circuit 7 into a main monitoring voltage (the high-power monitoring voltage V71), and converts the gain-non-inverted output signal (subordinate multiplier circuit output V8) from the subordinate multiplier circuit 8 into a subordinate monitoring voltage (high-power monitoring voltage V81). When the absolute value of the difference |V71−V81| between the main monitoring voltage and the subordinate monitoring voltage exceeds the difference diagnosis threshold Vth, the circuit voltage is diagnosed as abnormal (FIG. 6). Therefore, in addition to effect (1), the abnormality diagnosis process is simplified, in addition to which, when an abnormality occurs in the main multiplier circuit 7 and the subordinate multiplier circuit 8, which are the voltage sensors, it is possible to diagnose the voltage sensor abnormality with good responsiveness.

(3) The circuit voltage of the system circuit is DC voltage. The output characteristic of the main multiplier circuit 7 is set using a characteristic in which the reference gain K0 passes through the zero voltage point and the maximum voltage point of the main multiplier circuit output [Vout]. The absolute value of the gain |−K1| is set to be smaller than the reference gain K0, and the characteristic of the subordinate multiplier circuit 8 is set to a characteristic in which the offset V8off is added to the dead zone region in which the subordinate multiplier circuit output [Vout] is small (FIG. 5). Therefore, in addition to effect (1) or (2), even if the main multiplier circuit 7 and the subordinate multiplier circuit 8 are configured using low-cost but reliable bipolar elements, the influence of the dead zone would be eliminated, and it is possible to accurately diagnose voltage sensor abnormalities in all monitoring sections.

(4) A monitoring device 3 for diagnosing a normality/abnormality of the voltage sensor that detects the circuit voltage in a system circuit of an electrical equipment system (vehicle-mounted motor control system) is provided. In the voltage sensor diagnostic method, the monitoring device 3 includes the main multiplier circuit 7, the subordinate multiplier circuit 8, and the abnormality diagnosis circuit 9. The main multiplier circuit 7 receives the circuit voltage as the input monitoring voltage [Vin] and outputs a gain-non-inverted output signal without gain-inversion as the detected value of the circuit voltage. The subordinate multiplier circuit 8 receives the circuit voltage as the input monitoring voltage [Vin] and outputs a gain-inverted output signal, obtained by gain-inversion of the gain-non-inverted output signal, as the detected value of the circuit voltage. The abnormality diagnosis circuit 9 diagnoses abnormalities of the main multiplier circuit 7 and the subordinate multiplier circuit 8, which are the voltage sensors, based on the gain-non-inverted output signal and the gain-inverted output signal (FIG. 2). As a result, it is possible to provide a voltage sensor diagnostic method that detects abnormalities in which the detected voltage values of the circuit voltage vary in the same direction.

Second Embodiment

The second embodiment is an example in which an offset is added to the output characteristic of the subordinate multiplier circuit, while making the absolute values of the gain of the output characteristics of the two multiplier circuits the same.

Figure 7:
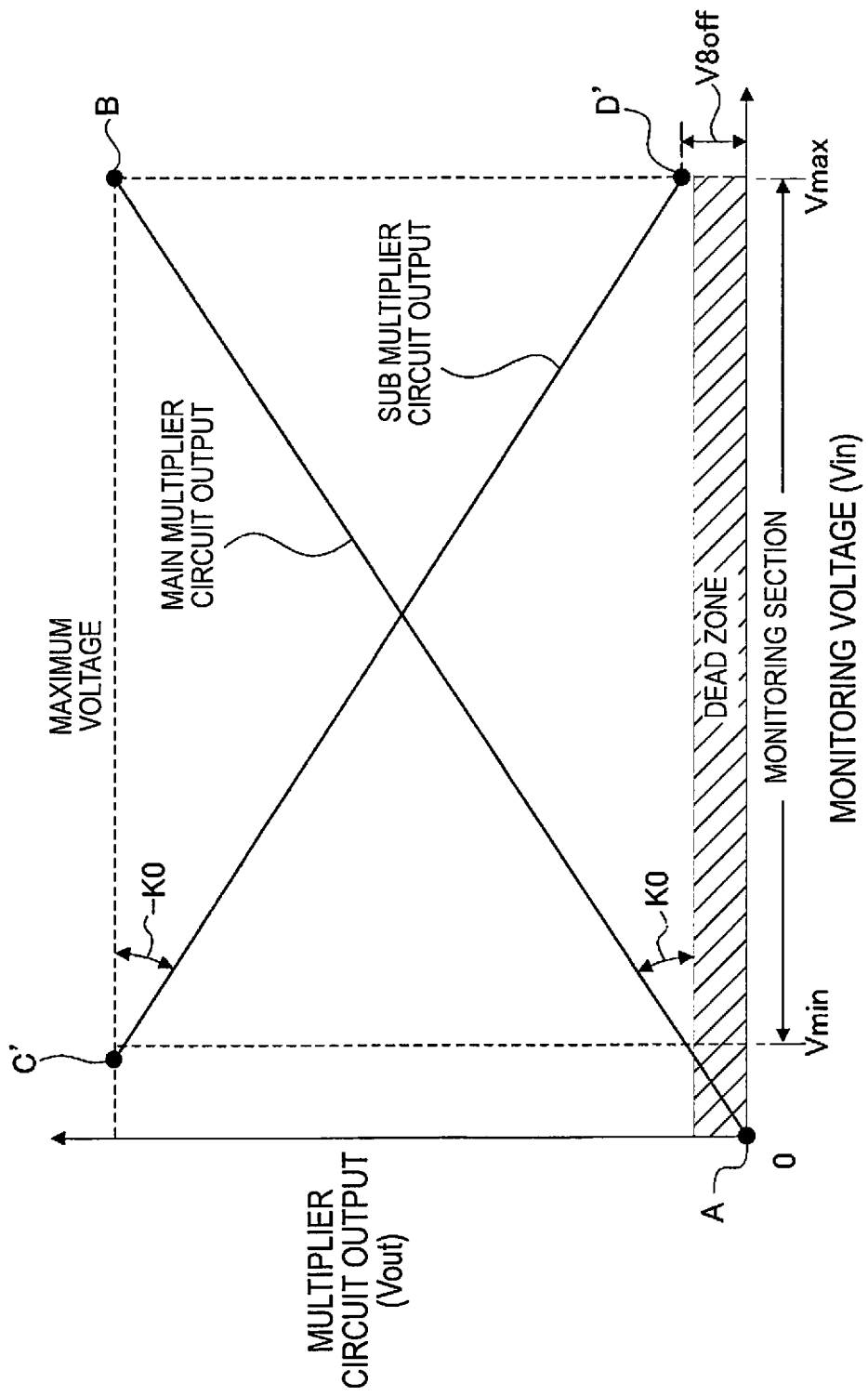
FIG. 7 is a multiplier circuit output characteristic diagram illustrating the main multiplier circuit output characteristic and the subordinate multiplier circuit output characteristic in the monitoring device according to a second embodiment.

FIG. 7 illustrates the main multiplier circuit output characteristic and the subordinate multiplier circuit output characteristic in the monitoring device according to the second embodiment. The output characteristic of the subordinate multiplier circuit will be described on FIG. 7. The system configuration and the configuration of the monitoring device 3 (the main multiplier circuit 7, the abnormality diagnosis circuit 9) are the same as in the first embodiment, so that illustrations and descriptions thereof are omitted.

By carrying out a parallel translation of the absolute value of the gain |−K0| to the high voltage side in the same manner as the reference gain K0, the output characteristic of the subordinate multiplier circuit 8 can be set using a characteristic in which the offset V8off is added to the dead zone region in which the subordinate multiplier circuit output [Vout] is small, as shown in FIG. 7. The output characteristic of the subordinate multiplier circuit is a negatively sloped linear characteristic that connects a maximum voltage point C' (the intersection of the subordinate multiplier circuit output 5 V and the monitoring voltage of about 50 V) and the minimum voltage point D' (for example, the intersection of the subordinate multiplier circuit output of 0.5 V and the monitoring voltage of 600 V). The offset V8off is the amount of parallel translation toward the high voltage side, and is set so as to avoid the dead zone region of the subordinate multiplier circuit output [Vout].

Here, for example, in the case that the circuit configuration shown in FIG. 4 is used as the subordinate multiplier circuit 8 of the second embodiment, the gain −K0 (|K0|=K0) of the output characteristic of the subordinate multiplier circuit is $$-K0 = -\{R81b/(R81a+R81b)\}\cdot(R84b/R84a)$$

and the adjustment of the gain −K0 is carried out by setting the respective resistances R81a, R81b, R84a, R84b of the gain-adjustment resistors 81a, 81b, 84a, 84b.

In addition, the offset V8off is $$V8\text{off} = -\{R81b/(R81a+R81b)\}\cdot(R84b/R84a)\cdot V\text{max} + \{(R84a+R84b)/R84a\}\cdot V85$$

and the adjustment of the offset V8off is carried out by setting the respective resistances R84a, R84b of the gain-adjustment resistors 84a, 84b and the reference power source voltage V85 of the reference power source 85.

Next, the operation of the voltage sensor abnormality diagnosis by means of offset addition according to the second embodiment will be described. In the second embodiment, the output characteristic of the main multiplier circuit 7 is set using a characteristic in which the reference gain K0 passes through the zero voltage point and the maximum voltage point of the main multiplier circuit output [Vout]. By carrying out a parallel translation of the absolute value of the gain |−K0| toward the high voltage side in the same manner as the reference gain K0, the output characteristic of the subordinate multiplier circuit 8 can be set using a characteristic in which the offset V8off is added to a dead zone region in which the main multiplier circuit output [Vout] is small.

That is, by carrying out a parallel translation of the entire characteristic toward the high voltage side while making the absolute value of the gain |−K0| of the output characteristic of the subordinate multiplier circuit the same as the reference gain K0, the offset V8off can be added to a dead zone region where the subordinate multiplier circuit output [Vout]

is small. As a result, as shown in the output characteristic of the subordinate multiplier circuit (solid line characteristic) in FIG. 7, it is possible to prevent the subordinate multiplier circuit output [Vout] in the vicinity of the maximum monitoring voltage Vmax of the monitoring voltage from entering the saturation region (dead zone).

Then, in the case of the second embodiment, the system at most needs to monitor the minimum monitoring voltage Vmin (for example, about 60 V). As a result, in regard to the output characteristic of the subordinate multiplier circuit, there is no problem even if the region below the monitoring voltage of about 50 V falls outside of the monitoring region, as shown in FIG. 7. In addition, in regard to the output characteristic of the main multiplier circuit, the main multiplier circuit output [Vout] in the vicinity of the minimum monitoring voltage Vmin of the monitoring voltage is prevented from entering the saturation region (the dead zone), even if a characteristic in which an offset has been added, as shown in FIG. 7, were not used.

Accordingly, even if the main multiplier circuit 7 and the subordinate multiplier circuit 8 are configured from low-cost but reliable bipolar elements, it is possible to accurately diagnose voltage sensor abnormalities in all the monitoring sections (the minimum monitoring voltage Vmin to the maximum monitoring voltage Vmax). In addition, since the absolute values of the gain of the main multiplier circuit 7 and the subordinate multiplier circuit 8 are made the same, compared to the first embodiment, it is possible to improve the accuracy of the voltage sensor abnormality diagnosis by means of the subordinate multiplier circuit 8. The other operations are the same as those in the first embodiment, so that the descriptions thereof are omitted.

Next, the effects are described. The effects listed below can be obtained according to the voltage sensor diagnostic device of the second embodiment.

(5) The circuit voltage in the system circuit is a DC voltage. The output characteristic of the main multiplier circuit 7 is set using a characteristic in which the reference gain K0 passes through the zero voltage point and the maximum voltage point of the main multiplier circuit output [Vout]. By carrying out a parallel translation of the absolute value of the gain |−K0| toward the high voltage side in the same manner as the reference gain K0, the output characteristic of the subordinate multiplier circuit 8 can be set to a characteristic in which the offset V8off is added to the dead zone region in which the subordinate multiplier circuit output [Vout] is small (FIG. 7). Therefore, in addition to effect (1) or (2), even if the main multiplier circuit 7 and the subordinate multiplier circuit 8 were configured from low-cost but reliable bipolar elements, the influence of the dead zone would be eliminated, and it is possible to accurately diagnose voltage sensor abnormalities in all the monitoring sections. In addition, since the absolute value of the gain with respect to the output of the subordinate multiplier circuit 8 is the same as the gain of the main multiplier circuit 7, compared to the first embodiment, it is possible to improve the accuracy of the voltage sensor abnormality diagnosis by means of the subordinate multiplier circuit 8.

Third Embodiment

The third embodiment is an example in which an offset is added to the output characteristic of the main multiplier circuit and the output characteristic of the subordinate multiplier circuit, while making the absolute values of the gain of the output characteristics of the two multiplier circuits the same.

The configuration of the main multiplier circuit and the configuration of the subordinate multiplier circuit according to the third embodiment will be described below with reference to FIGS. 8 to 10. The system configuration and the configuration of the abnormality diagnosis circuit 9 of the monitoring device 3 are the same as in the first embodiment, so that illustrations and descriptions thereof are omitted.

Main Multiplier Circuit Configuration

Figure 8:
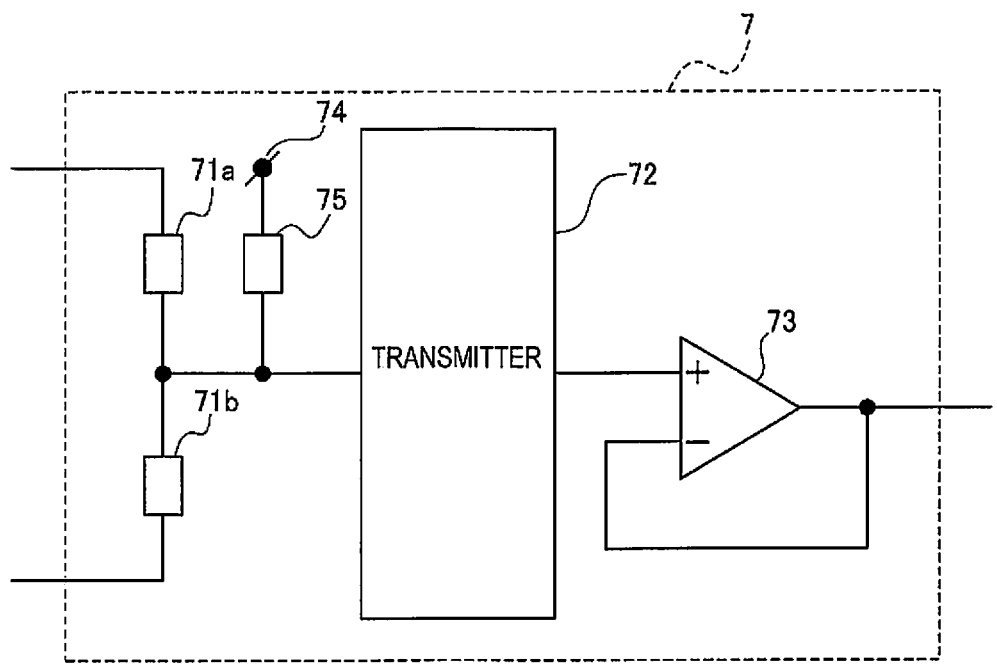
FIG. 8 is a circuit block diagram illustrating a configuration example of the main multiplier circuit in the monitoring device according to a third embodiment.
Figure 10:
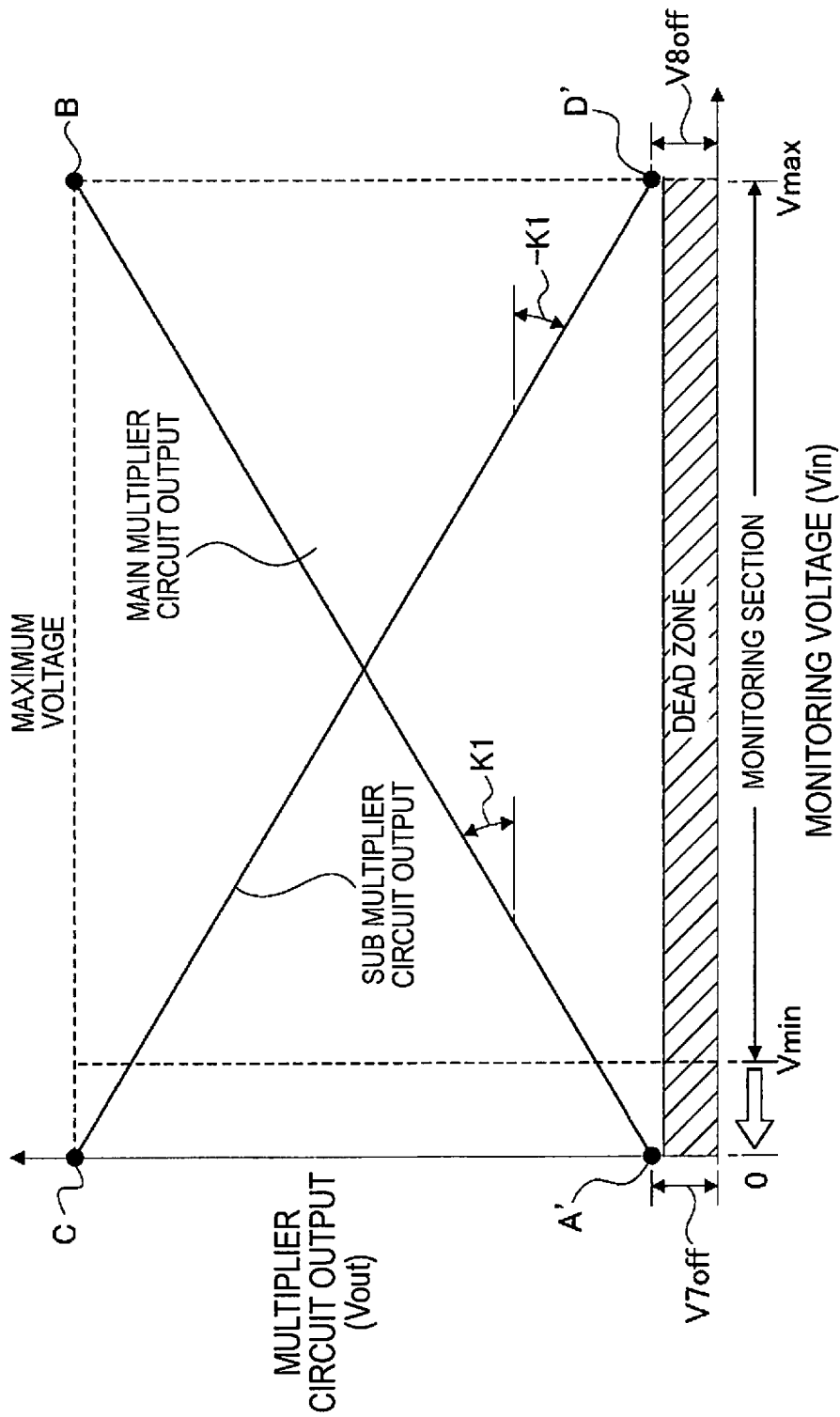
FIG. 10 is a multiplier circuit output characteristic diagram illustrating the main multiplier circuit output characteristic and the subordinate multiplier circuit output characteristic in the monitoring device according to the third embodiment.

FIG. 8 illustrates a configuration example of the main multiplier circuit 7 in the monitoring device 3 according to the third embodiment, and FIG. 10 illustrates the output characteristic of the main multiplier circuit. The detailed configuration of the main multiplier circuit 7 will be described below with reference to FIGS. 8 and 10.

As shown in FIG. 8, the main multiplier circuit 7 includes the gain-adjustment resistor 71a, the gain-adjustment resistor 71b, the transmitter 72, the operational amplifier 73, a circuit power source 74, and an offset adjustment resistor 75. The circuit configuration of the operational amplifier 73 uses bipolar transistors.

In this main multiplier circuit 7, the signal, voltage-divided by the gain-adjustment resistor 71a and the gain-adjustment resistor 71b, is input to the operational amplifier 73 via the transmitter 72 across an insulator, and the gain-non-inverted output signal is output by the operational amplifier 73. The transmitter 72 can output an analog signal from an analog input signal. The transmitter 72 can also output an analog signal from a digital input signal. In this case, the operational amplifier 73 is not necessary. In addition, gain-adjustment can be carried out by a general multiplier circuit that uses the operational amplifier 73 and a resistor. Moreover, the addition adjustment by the offset can be carried out by adjusting the voltage of the circuit power source 74, by adjusting the resistance value of the offset adjustment resistor 75, or by adjusting both.

The main multiplier circuit 7 sets the gain K1 to be smaller than the reference gain K0 with which the main multiplier circuit output [Vout] passes through the zero voltage point and the maximum voltage point. Then, the output characteristic of the main multiplier circuit is set to a characteristic in which an offset V7off is added to a dead zone region in which the main multiplier circuit output [Vout] is small, as shown in FIG. 10. That is, the output characteristic of the main multiplier circuit is a positively sloped linear characteristic that connects a minimum voltage point A' (for example, intersection of main multiplier circuit output of 0.5 V and monitoring voltage of 0V) and a maximum voltage point B (for example, intersection of main multiplier circuit output of 5 V and monitoring voltage of 600 V).

Here, since the output characteristic of the main multiplier circuit can be derived from an input/output relation characteristic in which the monitoring voltage [Vin] is the horizontal axis and the main multiplier circuit output [Vout] is the vertical axis, the output can be expressed by the following equation $$Vout=\{R71bR75/(R71aR71b+R71aR75+R71bR75)\} \cdot Vin+\{(R71aR71b)/(R71aR71b+R71aR75+R71bR75)\} \cdot V74$$

As is clear from this equation, the gain K1 is $$K1=\{R71bR75/(R71aR71b+R71aR75+R71bR75)\}$$

and the adjustment of the gain K1 is carried out by setting the resistance R71a of the gain-adjustment resistor 71a, the resistance R71b of the gain-adjustment resistor 71b, and the resistance R75 of the offset adjustment resistor 75.

In addition, the offset V7off is $$V7\text{off}=\{(R71aR71b)/(R71aR71b+R71aR75+R71bR75)\}\cdot V74$$

and the adjustment of the offset V7off is carried out by setting the resistance R71a of the gain-adjustment resistor 71a, the resistance R71b of the gain-adjustment resistor 71b, the resistance R75 of the offset adjustment resistor 75, and a circuit power source voltage V74 of the circuit power source 74.

Subordinate Multiplier Circuit Configuration

Figure 9:
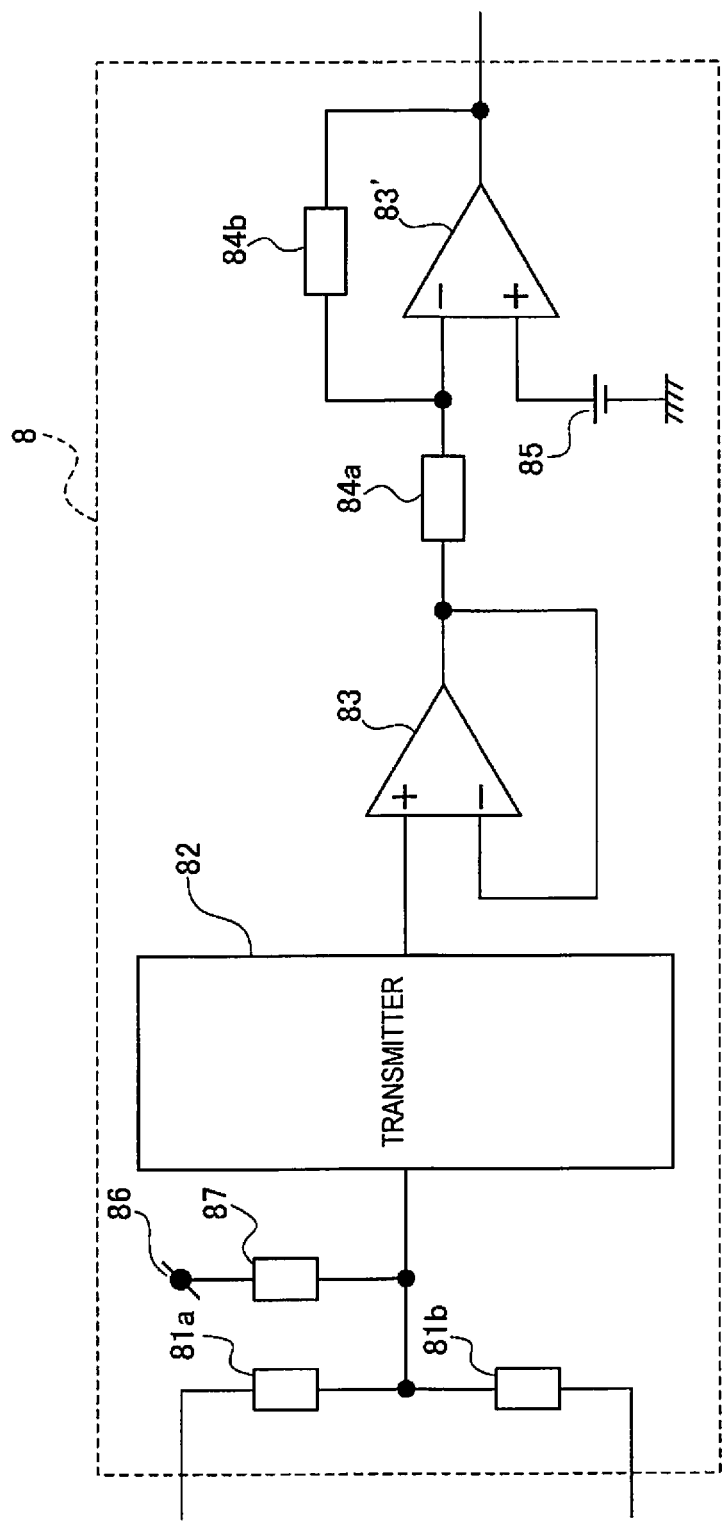
FIG. 9 is a circuit block diagram illustrating a configuration example of the subordinate multiplier circuit in the monitoring device according to the third embodiment.

FIG. 9 illustrates a configuration example of the subordinate multiplier circuit 8 in the monitoring device 3 according to the third embodiment, and FIG. 10 illustrates the output characteristic of the subordinate multiplier circuit. The detailed configuration of the subordinate multiplier circuit 8 will be described below with reference to FIGS. 9 and 10.

As shown in FIG. 9, the subordinate multiplier circuit 8 includes the gain-adjustment resistor 81a, the gain-adjustment resistor 81b, the transmitter 82, the operational amplifier 83, the gain-adjustment resistor 84a, the gain-adjustment resistor 84b, the operational amplifier 83', the reference power source 85, a circuit power source 86, and an offset adjustment resistor 87. The circuit configurations of the operational amplifiers 83, 83' use bipolar transistors.

In other words, the subordinate multiplier circuit 8 is obtained by adding a gain-inversion circuit composed of the operational amplifier 83', the gain-adjustment resistors 84a, 84b, and the reference power source 85 to the configuration of the main multiplier circuit 7. As with the transmitter 72, the transmitter 82 can output an analog signal from an analog input signal. The transmitter can also output an analog signal from a digital input signal.

By setting the absolute value of the gain |−K1| to be the same as the gain K1 of the output characteristic of the main multiplier circuit, the output characteristic of the subordinate multiplier circuit 8 can be set to a characteristic in which an offset V8off is added to a dead zone region in which the subordinate multiplier circuit output [Vout] is small, as shown in FIG. 10. The output characteristic of the subordinate multiplier circuit is a negatively sloped linear characteristic that connects a maximum voltage point C (intersection of subordinate multiplier circuit output 5 V and monitoring voltage 0V) and a minimum voltage point D' (for example, intersection of subordinate multiplier circuit output 0.5 V and monitoring voltage 600 V). The offset V8off is set so as to avoid the dead zone region of the subordinate multiplier circuit output [Vout].

Here, since the output characteristic of the subordinate multiplier circuit can be derived from an input/output relation characteristic in which the monitoring voltage [Vin] is the horizontal axis and the subordinate multiplier circuit output [Vout] is the vertical axis, the output characteristic can be expressed by the following equation $$V\text{out}=-\{R81bR87/(R81aR81b+R81aR87+R81bR87)\}\cdot(R84b/R84a)\cdot V\text{in}+\{R81bR87/(R81aR81b+R81aR87+R81bR87)\}\cdot(R84b/R84a)\cdot V86+\{(R84a+R84b)/R84a\}\cdot V85$$

As is clear from this equation, the gain −K1 is $$-K1=-\{R81bR87/(R81aR81b+R81aR87+R81bR87)\}\cdot(R84b/R84a)$$

and the adjustment of the gain −K1 is carried out by setting the respective resistances R81a, R81b, R84a, R84b of the gain-adjustment resistors 81a, 81b, 84a, 84b, and the resistance R87 of the offset adjustment resistor 87.

In addition, the offset V8off is $$V8\text{off}=-\{R81b/(R81a+R81b)\}\cdot(R84b/R84a)\cdot V\text{max}+\{R81bR87/(R81aR81b+R81aR87+R81bR87)\}\cdot(R84b/R84a)\cdot V86+\{(R84a+R84b)/R84a\}\cdot V85$$

and the adjustment of the offset V8off is carried out by setting the resistances R84a, R84b of the gain-adjustment resistors 84a, 84b, the resistances R81a, R81b, R84a, R84b of the gain-adjustment resistors 81a, 81b, 84a, 84b, the resistance R87 of the offset adjustment resistor 87, the circuit power source voltage V86 of the circuit power source 86, and the reference power source voltage V85 of the reference power source 85.

Next, the operation of the voltage sensor abnormality diagnosis by means of offset addition according to the third embodiment will be described. In the third embodiment, by setting the gain K1 to be smaller than the reference gain K0, the output characteristic of the main multiplier circuit 7 can be set to a characteristic in which an offset V7off is added to a dead zone region in which the main multiplier circuit output [Vout] is small, as shown in FIG. 10. By setting the absolute value of the gain |−K1| to be the same as the gain K1 of the output characteristic of the main multiplier circuit, the output characteristic of the subordinate multiplier circuit 8 can be set to a characteristic in which an offset V8off is added to a dead zone region in which the subordinate multiplier circuit output [Vout] is small.

That is, since the offset V7off is added to the output characteristic of the main multiplier circuit, as shown in the output characteristic of the main multiplier circuit of FIG. 10, the main multiplier circuit output [Vout] is prevented from entering the saturation region (dead zone), even when the monitoring voltage is zero. Similarly, since the offset V8off is added to the output characteristic of the subordinate multiplier circuit, as shown in the output characteristic of the subordinate multiplier circuit of FIG. 10, the subordinate multiplier circuit output [Vout] in the vicinity of the maximum monitoring voltage Vmax of the monitoring voltage is prevented from entering the saturation region (dead zone).

That is, in the case of the third embodiment, by adding the offset V7off to the dead zone region in which the main multiplier circuit output [Vout] of the output characteristic of the main multiplier circuit is small, the monitoring result is prevented from entering the saturation region (dead zone) even if the minimum monitoring voltage Vmin of the monitoring voltage [Vin] is expanded to zero voltage. In other words, even in a system in which the zero voltage to the maximum voltage of the monitoring voltage [Vin] is the monitoring section, the main multiplier circuit output [Vout] is prevented from entering the saturation region (dead zone).

Accordingly, even if the main multiplier circuit 7 and the subordinate multiplier circuit 8 are configured from low-cost but reliable bipolar elements, it is possible to accurately diagnose voltage sensor abnormalities in all the monitoring sections (minimum monitoring voltage Vmin to maximum monitoring voltage Vmax). In addition, since the offset V7off is added to the output characteristic of the main multiplier circuit, the abnormality diagnosis accuracy of the voltage sensor can be ensured, even if a monitoring section is changed so that the minimum monitoring voltage Vmin of the monitoring voltage [Vin] is expanded to the zero voltage side. The other operations are the same as those in the first embodiment, so that the descriptions thereof are omitted.

Next, the effects are described. The effects listed below can be realized by means of the voltage sensor diagnostic device of the third embodiment.

(6) The circuit voltage in the system circuit is a DC voltage. By setting the gain K1 to be smaller than the reference gain K0 with which the main multiplier circuit output [Vout] passes through the zero voltage point and the maximum voltage point, the main multiplier circuit 7 sets the output characteristic of the main multiplier circuit to a characteristic in which the offset V7off is added to the dead zone region in which the main multiplier circuit output [Vout] is small. By setting the absolute value of the gain |−K1| to be the same as the gain K1 of the output characteristic of the main multiplier circuit, the output characteristic of the subordinate multiplier circuit 8 can be set to a characteristic in which the offset V8off is added to a dead zone region in which the subordinate multiplier circuit output [Vout] is small (FIG. 10). Therefore, in addition to effect (1) or (2), even if the main multiplier circuit 7 and the subordinate multiplier circuit 8 are configured using low-cost but reliable bipolar elements, the influence of the dead zone is eliminated, and it is possible to accurately diagnose voltage sensor abnormalities in all the monitoring sections. In addition, the abnormality diagnosis accuracy of the voltage sensor can be ensured, even if a monitoring section is changed so that the minimum monitoring voltage Vmin of the monitoring voltage [Vin] is expanded to the zero voltage side.

Fourth Embodiment

The fourth embodiment is an example in which the main multiplier circuit and the subordinate multiplier circuit are configured as circuits using MOS transistors (MOSFETs), and the output characteristic of the main multiplier circuit and the output characteristic of the subordinate multiplier circuit are set to characteristics in which an offset is not added.

Figure 11:
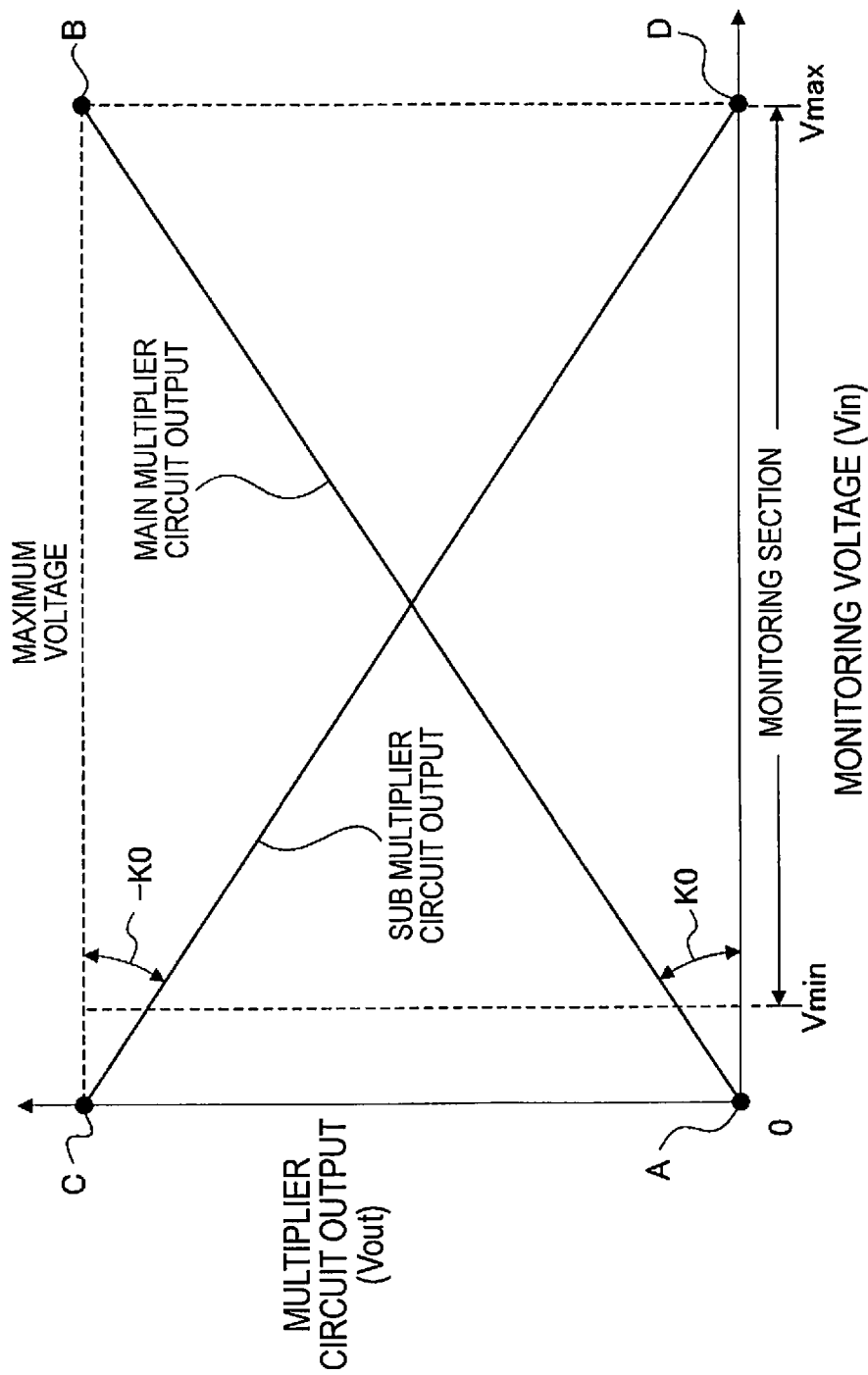
FIG. 11 is a multiplier circuit output characteristic diagram illustrating the main multiplier circuit output characteristic and the subordinate multiplier circuit output characteristic in the monitoring device according to a fourth embodiment.

FIG. 11 illustrates the main multiplier circuit output characteristic and the subordinate multiplier circuit output characteristic in the monitoring device according to the fourth embodiment. The configuration of the main multiplier circuit and the configuration of the subordinate multiplier circuit will be described below with reference to FIG. 11. The system configuration and the configuration of the abnormality diagnosis circuit 9 of the monitoring device 3 are the same as in the first embodiment, so that illustrations and descriptions thereof are omitted.

Main Multiplier Circuit Configuration

As shown in FIG. 3, the main multiplier circuit 7 includes a gain-adjustment resistor 71a, a gain-adjustment resistor 71b, a transmitter 72, and an operational amplifier 73. The circuit configuration of the operational amplifier 73 uses MOS transistors.

The output characteristic of the main multiplier circuit 7 is set to a characteristic in which the reference gain K0 passes through the zero voltage point and the maximum voltage point of the main multiplier circuit output [Vout], as shown in FIG. 11. That is, the output characteristic of the main multiplier circuit is a positively sloped linear characteristic that connects the zero voltage point A (intersection of main multiplier circuit output 0V and monitoring voltage 0V) and the maximum voltage point B (for example, intersection of main multiplier circuit output 5 V and monitoring voltage 600 V).

Here, since the output characteristic of the main multiplier circuit can be derived from an input/output relation characteristic in which the monitoring voltage [Vin] is the horizontal axis and the main multiplier circuit output [Vout] is the vertical axis, the output characteristic can be expressed by the following equation $$V\text{out} = \{R71b/(R71a+R71b)\} \cdot V\text{in}$$

As is clear from this equation, the gain K0 is $$K0 = R71b/(R71a+R71b)$$

and the adjustment of the reference gain K0 is carried out by setting the resistance R71a of the gain-adjustment resistor 71a and the resistance R71b of the gain-adjustment resistor 71b.

Subordinate Multiplier Circuit Configuration

As shown in FIG. 4, the subordinate multiplier circuit 8 includes the gain-adjustment resistor 81a, the gain-adjustment resistor 81b, the transmitter 82, the operational amplifier 83, the gain-adjustment resistor 84a, the gain-adjustment resistor 84b, the operational amplifier 83', and the reference power source 85. The circuit configurations of the operational amplifiers 83, 83' use MOS transistors.

Here, the gain-adjustment resistor 81a and the gain-adjustment resistor 81b are set to the same ratio as the gain-adjustment resistor 71a and the gain-adjustment resistor 71b of the main multiplier circuit 7. Then, the gain-adjustment resistor 84a and the gain-adjustment resistor 84b are set to a ratio of 1:1, and the reference power source 85 is set to ½ of the output range of the main multiplier circuit 7. By means of this setting, the subordinate multiplier circuit 8 shown in FIG. 4 has an inverted output in which the output of the main multiplier circuit 7 shown in FIG. 3 is folded back at the ½ point of the output range.

By setting the absolute value of the gain |−K0| to be the same as the reference gain K0, the output characteristic of the subordinate multiplier circuit 8 can be set to a characteristic having the gain −K0 passes through the maximum voltage point and zero voltage point of the subordinate multiplier circuit output [Vout], as shown in FIG. 11. The output characteristic of the subordinate multiplier circuit is a negatively sloped linear characteristic that connects the maximum voltage point C (intersection of subordinate multiplier circuit output of 5 V and monitoring voltage of 0V) and a zero voltage point D (intersection of subordinate multiplier circuit output of 0V and monitoring voltage of 600 V).

Next, the operation of the voltage sensor abnormality diagnosis according to the fourth embodiment will be described. If the main multiplier circuit 7 and the subordinate multiplier circuit 8 are configured as circuits using MOS transistors (MOSFETs), the main multiplier circuit output and the subordinate multiplier circuit output will not have dead zones. That is, in the first to the third embodiments, i.e., in the case of using circuits configured from bipolar elements, it is not possible to output complete low levels or complete high levels due to the saturation characteristics of bipolar transistors, which results in dead zones. In contrast, a MOS transistor, which is a type of a field-effect transistor, is capable of outputting a complete low level or a complete high level.

Therefore, in the fourth embodiment, the output characteristic of the main multiplier circuit 7 is set to a characteristic having the reference gain K0, and no offset is added, as shown in FIG. 11. The output characteristic of the subordinate multiplier circuit 8 is set to a characteristic in which the absolute value of the gain |−K0| is set to be the same as the reference gain K0, and no offset is added.

As a result, as indicated by the output characteristic of the main multiplier circuit and the output characteristic of the subordinate multiplier circuit in FIG. 11, the main multiplier circuit output [Vout] and the subordinate multiplier circuit output [Vout] are prevented from entering the saturation region (dead zone), even in a system in which the zero voltage to the maximum voltage of the monitoring voltage is the monitoring section.

Therefore, when the main multiplier circuit 7 and the subordinate multiplier circuit 8 are circuits configured from MOS transistors, it is possible to accurately diagnose voltage sensor abnormalities regardless of the voltage range of the monitoring section, while the output characteristic of the main multiplier circuit and the output characteristic of the subordinate multiplier circuit are configured to have simple inverted characteristics. The other operations are the same as those in the first embodiment, so that the descriptions thereof are omitted.

Next, the effects are described. The effects listed below can be obtained according to the voltage sensor diagnostic device of the fourth embodiment.

(7) The circuit voltages of the system circuit are DC voltages.

The output characteristic of the main multiplier circuit 7 is set to a characteristic having a reference gain K0 that passes through the zero voltage point and the maximum voltage point of the main multiplier circuit output [Vout]. The output characteristic of the subordinate multiplier circuit 8 is set to a characteristic having an inverted gain −K0 in which the absolute value of the gain |−K0| is the same as the reference gain K0 and which passes through the maximum voltage point and zero voltage point of the subordinate multiplier circuit output [Vout] (FIG. 11). Therefore, in addition to effect (1) or (2), when the main multiplier circuit 7 and the subordinate multiplier circuit 8 are circuits configured from MOS transistors, it is possible to accurately diagnose voltage sensor abnormalities regardless of the voltage range of the monitoring section, while the output characteristics of the two multiplier circuits can be configured to have simple inverted characteristics.

The voltage sensor diagnostic device and the voltage sensor diagnostic method according to the present disclosure have been described based on the first to the fourth embodiments. However, specific configurations are not limited to the first to the fourth embodiments, and various modifications and additions to the design can be made without departing from the scope of the invention according to each claim of the Claims section.

In the first to the second embodiments, examples were presented in which an offset is added to the output characteristic of the subordinate multiplier circuit; and in the third embodiment, an example was presented in which an offset is added to the output characteristic of the main multiplier circuit and the output characteristic of the subordinate multiplier circuit. However, in order to avoid deterioration of the voltage detection accuracy of the main multiplier circuit and the subordinate multiplier circuit, which are the voltage sensors, a switching means, in which an offset is added only during execution of abnormality diagnosis by means of difference detection, can be provided instead.

In the first to the fourth embodiments, examples were presented in which the main multiplier circuit 7 has the circuit configuration shown in FIG. 3 or the circuit configuration shown in FIG. 8. However, the main multiplier circuit is not limited to the circuit configurations shown in FIGS. 3 and 8, but can have other equivalent circuit configurations.

In the first to the fourth embodiments, examples were presented in which the subordinate multiplier circuit 8 has the circuit configuration shown in FIG. 4 or the circuit configuration shown in FIG. 9. However, the subordinate multiplier circuit is not limited to the circuit configurations shown in FIGS. 4 and 9, but can have other equivalent circuit configurations.

In the first to the fourth embodiments, examples were shown in which the voltage sensor diagnostic device and the voltage sensor diagnostic method of the present disclosure are applied to a vehicle-mounted motor control system for controlling a motor/generator mounted on a drive source of an electrically driven vehicle, such as an electric vehicle or a hybrid vehicle. However, the voltage sensor diagnostic device and the voltage sensor diagnostic method of the present disclosure can also be applied to various electrical equipment systems, as long as the system diagnoses voltage sensors of a system circuit.

The invention claimed is:

1. A voltage sensor diagnostic device comprising:
a monitoring device for diagnosing a normality/abnormality of a voltage sensor that detects a circuit voltage in a system circuit of an electrical equipment system, the monitoring device including
a main multiplier circuit that receives, as input, the circuit voltage as a monitoring voltage and outputs a gain-non-inverted signal as a detected value of the circuit voltage;
a subordinate multiplier circuit that receives, as input, the circuit voltage as the monitoring voltage and outputs a signal that is gain-inverted with respect to the output signal from the main multiplier circuit as the detected value of the circuit voltage, and
an abnormality diagnosis circuit diagnoses abnormalities in the main multiplier circuit and the subordinate multiplier circuit, which are voltage sensors, based on a gain-non-inverted output signal from the main multiplier circuit and the gain-inverted output signal from the subordinate multiplier circuit,
the abnormality diagnosis circuit
converts the gain-non-inverted output signal from the main multiplier circuit into a main monitoring voltage,
converts the gain-inverted output signal from the subordinate multiplier circuit to a subordinate monitoring voltage, and
diagnoses an abnormality in the main multiplier circuit and the subordinate multiplier circuit when an absolute value of a difference between the main monitoring voltage and the subordinate monitoring voltage exceeds a difference diagnosis threshold.

2. The voltage sensor diagnostic device according to claim 1, wherein
the circuit voltage of the system circuit is a DC voltage,
an output characteristic of the main multiplier circuit is set to a characteristic having a reference gain passes through a zero voltage point and a maximum voltage point of the main multiplier circuit output, and
an output characteristic of the subordinate multiplier circuit is set to a characteristic in which an offset is added to a dead zone region in which a subordinate multiplier circuit output is small by setting an absolute value of the gain to be smaller than the reference gain.

3. The voltage sensor diagnostic device according to claim 1, wherein
the circuit voltage in the system circuit is a DC voltage,
an output characteristic of the main multiplier circuit is set to a characteristic having a reference gain that passes through a zero voltage point and a maximum voltage point of main multiplier circuit output, and an output characteristic of the subordinate multiplier circuit is set to a characteristic in which an offset is added to a dead zone region in which a subordinate multiplier circuit output is small by carrying out a parallel translation of an absolute value of the gain toward a high voltage side in a same manner as the reference gain.

4. The voltage sensor diagnostic device according to claim 1, wherein the circuit voltage in the system circuit is a DC voltage, an output characteristic of the main multiplier circuit is set to a characteristic in which an offset is added to a dead zone region in which a main multiplier circuit output is small by setting the gain to be smaller than a reference gain that passes through the zero voltage and the maximum voltage point of main multiplier circuit output, and an output characteristic of the subordinate multiplier circuit is set to a characteristic in which an offset is added to a dead zone region in which a subordinate multiplier circuit output is small, by setting an absolute value of the gain to be the same as the gain of the output characteristic of the main multiplier circuit.

5. The voltage sensor diagnostic device according to claim 1, wherein the circuit voltage in the system circuit is a DC voltage, an output characteristic of the main multiplier circuit is set to a characteristic having a reference gain that passes through a zero voltage point and a maximum voltage point of the main multiplier circuit output, and an output characteristic of the subordinate multiplier circuit is set to a characteristic having an inverted gain in which an absolute value of the gain is the same as the reference gain and which passes through the maximum voltage point and the zero voltage point of the subordinate multiplier circuit output.

6. A voltage sensor diagnostic method using a monitoring device for diagnosing a normality/abnormality of a voltage sensor that detects a circuit voltage in a system circuit of an electrical equipment system, the monitoring device including a main multiplier circuit, a subordinate multiplier circuit, and an abnormality diagnosis circuit, the method comprising:

inputting the circuit voltage as a monitoring voltage into the main multiplier circuit and outputting a gain-non-inverted output signal without gain-inversion as a detected value of the circuit voltage;

inputting the circuit voltage as a monitoring voltage into the subordinate multiplier circuit and outputting a gain-inverted output signal with gain inversion with respect to the gain-non-inverted output signal as the detected value of the circuit voltage;

diagnosing an abnormality in the main multiplier circuit and the subordinate multiplier circuit, which are the voltage sensors, using the abnormality diagnosis circuit diagnoses based on the gain-non-inverted output signal and the gain-inverted output signal;

converting the gain non-inverted output signal from the main multiplier circuit to a main monitoring voltage, converting the gain inverted output signal from the subordinate multiplier circuit to a subordinate monitoring voltage, and diagnosing an abnormality in the main multiplier circuit and the subordinate multiplier circuit when an absolute value of a difference between the main monitoring voltage and the subordinate monitoring voltage exceeds a difference diagnosis threshold.

\* \* \* \* \*